United States Patent [19]
Pal et al.

[11] Patent Number: 5,532,071
[45] Date of Patent: Jul. 2, 1996

[54] PROCESS FOR SEALING HIGH-TEMPERATURE FUEL CELLS

[75] Inventors: Uday Pal, Needham, Mass.; Harald Landes, Rückersdorf; Horst Greiner, Forchheim, both of Germany

[73] Assignee: Siemens Aktiengesellschaft, Munich, Germany

[21] Appl. No.: 426,561

[22] Filed: Apr. 19, 1995

Related U.S. Application Data

[63] Continuation of PCT/EP93/02982, filed Oct. 27, 1993.

[30] Foreign Application Priority Data

Oct. 28, 1992 [DE] Germany ........................... 42 36 441.8
Sep. 20, 1993 [DE] Germany ........................... 43 31 912.2

[51] Int. Cl.$^6$ ..................................................... H01M 8/04
[52] U.S. Cl. .................................. 429/12; 429/36; 429/39
[58] Field of Search .................................. 429/36, 39, 35, 429/12

[56] References Cited

FOREIGN PATENT DOCUMENTS

| | | |
|---|---|---|
| 0194373 | 9/1986 | European Pat. Off. . |
| 0355420 | 2/1990 | European Pat. Off. . |
| 0425939 | 5/1991 | European Pat. Off. . |
| 1275044 | 5/1972 | United Kingdom . |

OTHER PUBLICATIONS

Japanese Patent Abstract No. 890254694, Shinichi, dated Sep. 29, 1989.
Japanese Patent Abstract No. 62–268063. Katsuta, dated May 14, 1986.
Japanese Patent Abstract No. 63–285877, Murakami, dated May 19, 1987.
"High–Temperature Solid Oxide Fuel", Feduska et al., 6040 Journal of Power Sources, vol. 10, 1983, Jun.

*Primary Examiner*—John S. Maples
*Attorney, Agent, or Firm*—Herbert L. Lerner; Laurence A. Greenberg

[57] ABSTRACT

A process for sealing leaks gas spaces and/or gas channels between individual components of high-temperature fuel cells, includes introducing at least first and second and optionally further different gases at high temperature from the outside into the gas spaces and/or gas channels to be sealed off from one another, for flushing every leak with the first gas on one side and with the second or further gas on the other side. The first gas contains at least one gaseous compound that can be oxidized to form a metal ion-conducting and/or an oxygen ion-conducting oxide, and the second and optionally further gas contains oxygen and/or is able to give off oxygen. The first gas contains at least one oxidizable compound of at least one of the metals of an electrolyte material, a bipolar plate and electrodes of the fuel cells, and/or one element of the group including zirconium, nickel, calcium, magnesium, cerium and rare earth metal. A high-temperature fuel cell produced by the process includes individual components having previously leaking points therebetween. Inlays of metal ion-conducting and/or oxygen ion-conducting oxides are disposed in the vicinity of the previously leaking points. The inlays are formed of oxides of at least one of the metals of electrolyte material, a bipolar plate, electrodes, zirconium, nickel, calcium, magnesium, cerium, hafnium and rare earth metal.

23 Claims, 3 Drawing Sheets

PROCESS FOR SEALING HIGH-TEMPERATURE FUEL CELLS

CROSS REFERENCE TO RELATED APPLICATION

This application is a Continuation of International Application Ser. No. PCT/EP93/02982, filed Oct. 27, 1993.

BACKGROUND OF THE INVENTION

Field of the Invention

The invention relates to a process for sealing leaks in gas spaces and/or gas channels located between individual components of high-temperature fuel cells. The invention also relates to a fuel cell being sealed in accordance with the process.

High-temperature fuel cells, which are also known as solid oxide fuel cells (SOFCs), are suitable for converting not only hydrogen gas and carbon monoxide but also hydrocarbons, such as natural gas or propane storable in liquid form, with oxygen or oxygen from the air, because of their relatively high operating temperatures, which are in the range of from 800° to 1100° C. If water vapor is added to the fuel, then any development of soot at the high temperatures can be averted.

In known high-temperature fuel cells, solid electrolytes are used for temperature reasons. In that respect it is known to insert thin small solid electrolyte plates, essentially being formed of zirconium oxide and small added amounts of yttrium, between the electrodes. The electrodes, that is the anode and the cathode, are located on opposite sides of the electrolyte, and sintered to or onto it. For example, the anode may be formed of a porous cermet of nickel and zirconium oxide, and the cathode may be formed of an oxide compound of lanthanum, strontium and manganese. The electrodes cover both sides of the small electrolyte plate, except for a narrow peripheral region. So-called bipolar plates or end plates adjoin the two electrodes on the outside and they are formed of a material with good electrical conductivity and have supply channels, which are so-called grooved zones, for conducting the oxygen-containing gas to the cathode, for conducting the fuel to the anode and for removing the product of oxidation. Those usually plate-like components contact the electrodes and, with the edges of the grooves, they support the electrodes of the small electrolyte plates. Often they are provided with apertures on their edges for supplying and removing gas. In the region of those peripheral zones of the bipolar plates, the small electrolyte plates are surrounded by a frame of an electrically non-conductive material, which has the same thickness as the small electrolyte plates. That frame has apertures which are congruent with the apertures in the peripheral region of the bipolar plate. So-called window foils are inserted between the bipolar plates and the small electrolyte plate. Those foils have window-like apertures on the edges of which the free edges of the small solid electrolyte plates, that is those not occupied by electrodes, rest. The window foils also have apertures on their edges that are disposed congruently with the apertures of the bipolar plate. The window foils are of the same material as the bipolar plates. They have approximately the same thickness as the electrodes sintered to the small electrolyte plates and serve to join the small electrolyte plates, together with the electrodes and the frames surrounding them, to one another in a gas-tight fashion through the respective peripheral regions. At the same time the window foils seal off the gas spaces on the anode and cathode sides from one another and from the apertures in the frame, through the edge of the small electrolyte plates and through the frames that surround the small electrolyte plates. In known high-temperature fuel cells, the bipolar plates, the window foils, and the frame that surrounds the small electrolyte plates are soldered in gas-tight fashion to one another, with the interposition of a solder that melts at above the operating temperature.

The various gas spaces or gas channels on both sides of the electrolyte must be sealed off both from the outside and from one another in gas-tight fashion. That is necessary, among other reasons, in order to ensure that fuel and oxygen will not mix and form a chemical short circuit which reduces the overall efficiency and that moreover, because of hydrogen combustion, would lead to local overheating. Moreover, the sealing is also necessary in order to avert damage to the electrodes, which would otherwise be destroyed in the presence of the other respective reaction gas.

The article entitled "High-Temperature Solid Oxide Fuel Cell—Technical Status" in the Journal of Power Sources, Vol. 10, No. 1, 1983, pp. 89–102, very generally describes a process in which porous substrates are sealed in gas-tight fashion by means of the known processes of CVD and EVD. It has been demonstrated that during manufacture, even if that process is employed, leakage problems have repeatedly occurred in known high-temperature fuel cells. Particularly when a very great number of individual fuel cells are put together to make a fuel cell stack, with a great number of individual, serially as well as parallel-connected fuel cells, it is an extremely difficult problem if just a few fuel cells in the stack have leaks.

SUMMARY OF THE INVENTION

It is accordingly an object of the invention to provide a process for sealing high-temperature fuel cells and a fuel cell sealed by the process, which overcome the hereinafore-mentioned disadvantages of the heretofore-known methods and products of this general type and which improve the tightness of fuel cells with the least possible effort.

With the foregoing and other objects in view there is provided, in accordance with the invention, in a process for sealing leaks in at least one of gas spaces and gas channels located between individual components of high-temperature fuel cells having electrolyte material, a bipolar plate and electrodes each containing at least one metal, the improvement which comprises introducing at least first, second and optionally further different gases at high temperature from the outside into at least one of the gas spaces and gas channels to be sealed off from one another, for flushing every leak with the first gas on one side and with the second or further gas on the other side; the first gas comprising at least one gaseous compound that can be oxidized to form at least one of a metal ion-conducting and an oxygen ion-conducting oxide, and the second and optionally further gas comprising oxygen and/or being able to give off oxygen; and the first gas comprising at least one material selected from the group consisting of at least one oxidizable compound of at least one of the metals of the electrolyte material, the bipolar plate, the electrodes, and one element of the group consisting of zirconium, nickel, calcium, magnesium, cerium and rare earth metal.

With the objects of the invention in view, there is also provided a high-temperature fuel cell produced according to the process, comprising individual components having previously leaking points therebetween and including electrolyte material, a bipolar plate and electrodes containing at least one metal; inlays of at least one of metal ion-conducting and oxygen ion-conducting oxides disposed in the vicinity of the previously leaking points; and the inlays being formed of oxides of at least one of the metals of the electrolyte material, the bipolar plate, the electrodes, zirconium, nickel, calcium, magnesium, cerium, hafnium and rare earth metal.

Since at least two different gases are used, of which the first contains at least one gaseous compound that can be oxidized to form a metal ion-conducting and/or oxygen ion-conducting oxide, and the second and optionally further gases contain oxygen and/or can give off oxygen, and the various gas spaces and/or gas channels of the high-temperature fuel cells to be sealed off from one another and from the outside are acted upon at high temperature with the first, second and/or further gas in such a way that every leak is flushed on one side with the first gas and on the other side with the second or further gas in accordance with the invention, a way is shown as to how an individual leaking fuel cell or fuel cells, or stacks of fuel cells, that have come to leak can be sealed retroactively without being dismantled beforehand. A special advantage is that the deposits of material which finally lead to the sealing occur precisely only at those points where leaks are located and by way of which the various gases come into contact with one another. In the cases in which an oxygen ion-conducting oxide is formed, it is also possible, after the leak has been sealed by a monomolecular layer of the oxide, for oxygen ions to still pass through the layer and on the opposite side of the former leak to cause further gas reactions and therefore a further growth of the layer at a decreasing rate. This is analogously true for the other side of the leak, if a metal ion-conducting oxide is generated. The first gas contains at least one oxidizable, gaseous compound of one or more of the metals of the electrolyte material, the bipolar plate, the electrodes of the fuel cell, and/or of one of the elements of the group including zirconium, nickel, calcium, magnesium, cerium or rare earth metal.

According to the invention, a high-temperature fuel cell sealed by the above process has inlays of metal ion-conducting and/or oxygen ion-conducting oxides precisely at the previously leaking points between the various components, which have sealed off these leaks. Due to the contact of the first gas with the second gas, these layers form precisely at those points where these various gases come into contact with one another and oxidize the gaseous compounds of the metals, as a consequence of leaks in gaps or pores, for instance. These inlays can sinter together with the walls of the leaks and thus even replace the solder between the various components.

Such compounds meet the prerequisites of being in the presence of the second oxygen-containing gas and decomposing and forming solid oxygen ion-conducting and/or metal ion-conducting metal oxides, which precipitate out, bond to the underlying material, and in this way seal the cracks and gaps. Through the use of this provision, in the pores and the channels which are responsible for the leak, oxides will form that match the surrounding material in terms of their coefficient of expansion and are adapted to the physical conditions prevailing in the fuel cell in terms of their chemical property. The reason that this is so important is that in the event of different coefficients of expansion, given the very great temperature differences traversed in fuel cells when they are turned on and turned off again, and which range from room temperature to 1000° C., mechanical strains that could further enlarge the leaks would otherwise be created in the material deposited in the gaps and channels.

In accordance with another mode of the invention, an inert gas, such as $N_2$, or a noble gas, is admixed with the various gases, to adjust the reactivity.

In accordance with a further mode of the invention, the fuel cell is bathed with the first gas on the outside, and it experiences a flow through it of the second gas on the cathode side and of the further gas on the anode side. In this way, any leaks that lead to the outside can be sealed off.

In accordance with an added mode of the invention, in order to avoid damage to the anode, the fuel cell is acted upon on the anode side with water vapor, or a mixture of water vapor and hydrogen gas, as the further gas. On one hand, the oxygen activity of this gas is adequate to undertake the oxidation of the gaseous metal compounds of the first gas. On the other hand, however, it leaves the nickel particles of the anodes in the metallic state.

In accordance with an additional mode of the invention, the fuel cell is acted upon on the anode side with a carbon monoxide-containing and/or carbon dioxide-containing gas as the further gas. At high process temperatures, these gases are also capable of establishing an adequate amount of oxygen activity so that the gaseous metal compound of the first gas can be oxidized, without having the anodes destroyed by oxidation at the same time.

In accordance with yet another mode of the invention, the fuel cell is acted upon on the anode side by the first gas and on the cathode side by the second gas. In this way, all of the leaks between the gas spaces and/or channels during operation that carry oxygen and the operating fuel, can be sealed off. It is significant that the first gas is delivered to the anode side rather than to the cathode side, for instance. The anode can thus be protected against undesired oxidation.

In accordance with yet a further mode of the invention, the second gas contains oxygen, with which one or more of the components of the group including water vapor, noble gas and nitrogen is admixed in order to weaken its oxidative action. In this way, when the process is carried out, undesired reactions with the material of the walls can be averted.

In accordance with yet an added mode of the invention, the oxidizable gaseous compound of the first gas is a halogen compound. Halogen compounds have the property of decomposing at the process temperature in the presence of oxygen and of being convertible into solid metal oxide compounds.

In accordance with yet an additional mode of the invention, in the region of the contact surfaces to be sealed between the various components, before the components are assembled, a mixture of zirconium oxide, nickel, and/or an oxide and/or a precursor thereof with better electronic conductivity than zirconium oxide, and an additive are introduced, and the assembled fuel cell or fuel cell stack is heated, before or during the action by the first, second and further gas, to the sintering temperature. As a result of this provision, a thin ceramic layer of defined porosity, which fills up all of the gaps and furnishes ideal geometrical preconditions for the actual sealing operation, is created between the bearing surfaces of the components that are to be sealed.

In accordance with again another mode of the invention, the fuel cell is simplified significantly if a green, raw, crude or unfinished foil, of congruent form and dimensions and containing zirconium oxide and nickel and/or an oxide or a precursor thereof with better electronic conduction than zirconium oxide and an additive, is placed between the bearing surfaces to be sealed, prior to the assembly. In this way, obstructions of the gas channels can be avoided quite reliably.

In accordance with again a further mode of the invention, when the process is carried out, the gas pressure is adjusted to approximately from $10^{-3}$ to $10^{-5}$ bar. As a result, the free path length of the gas molecules amounts to approximately 100 μm. This value is higher than the diameter of the pores produced with the mixture placed between the sealing surfaces. As a result, better adhesion of the inlaid material to the leaks is achieved.

In accordance with again an added mode of the invention, intermittently, the gas pressure of the first gas is higher than that of the second or further gas, and vice versa. As a result, especially when the pressure difference changes in direction, the two gases can be better pressed into the gaps of the leaks in alternation. As a result, the meeting of these gases can essentially take place in the gaps and slits.

In accordance with a concomitant feature of the invention, there are provided applied layers of metal ion-conducting and/or oxygen ion-conducting oxides disposed on at least one of the inside and the outside of the previously leaking points.

Other features which are considered as characteristic for the invention are set forth in the appended claims.

Although the invention is illustrated and described herein as embodied in a process for sealing high-temperature fuel cells and a fuel cell sealed by the process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

PREFERRED DESCRIPTION OF THE EMBODIMENTS

Figure 1:
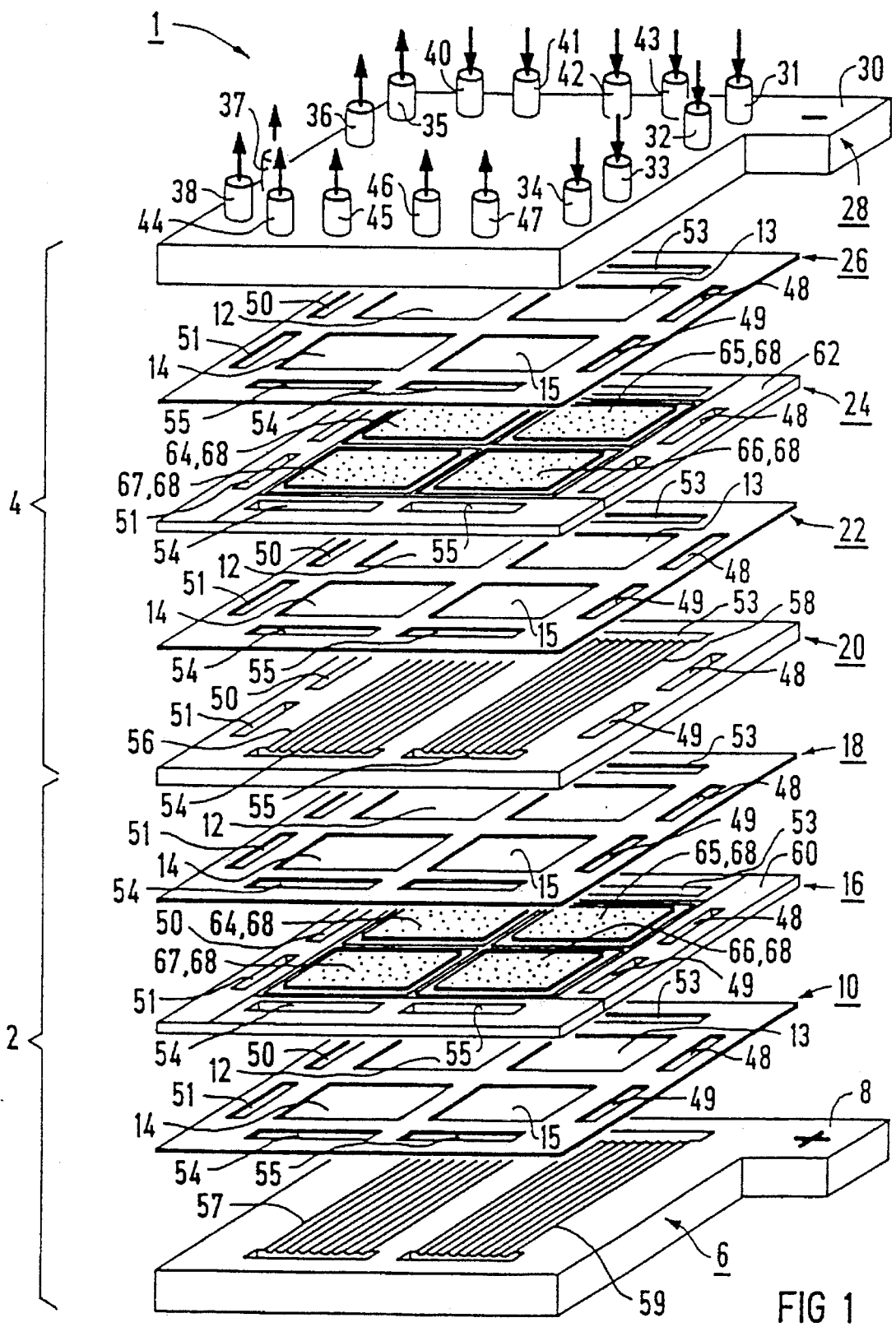
FIG. 1 is a diagrammatic, exploded, perspective view of a fuel cell stack having two series-connected high-temperature fuel cells.

Referring now to the figures of the drawing in detail and first, particularly, to the exploded view of FIG. 1 thereof, there is seen a stack 1 of two series-connected high-temperature fuel cells 2, 4, in which there is seen, as viewed from bottom to top, a lower cover plate 6 having positive contact tongues 8 extending laterally outward, a window foil 10 with four window apertures 12, 13, 14, 15, a solid electrolyte frame 16 with four small solid electrolyte plates 64, 65, 66, 67 inserted into it, a further window foil 18, a bipolar plate 20, a further window foil 22, a further solid electrolyte frame 24 with inserted small solid electrolyte plates, a further window foil 26, and an upper cover plate 28 with negative contact tongues 30 extending laterally to the outside. The upper cover plate 28 also has sixteen connection posts 31–38 and 40–47 for the delivery and removal of fuel-containing and oxygen-containing gas. With the exception of the two cover plates 6, 28, all of the window foils 10, 18, 22, 26, the solid electrolyte frames 16, 24, and the bipolar plate 20 have elongated apertures 48–55 in their peripheral regions. In the assembled stack 1, these apertures are aligned with one another and together form gas channels which are also referred to as "many-folding channels" that proceed in the direction of the normal to the plane of the plate, or in other words vertically through the stack 1. The connection posts 31–38, 41–47 of the upper cover plate 28 open into these gas channels.

In the exemplary embodiment, the bipolar plate 20 in the middle of the stack, which is disposed between the two fuel cells 2, 4 of the stack, has an upper surface with two grooved zones 56, 58, each of which connects one of two front apertures 54, 55 to an opposed rear aperture 52, 53 in the peripheral region of the bipolar plate 20. The bipolar plate 20 is constructed similarly on its lower surface, except that the two grooved zones are rotated by 90° relative to the top and connect apertures 48, 49 on the right-hand side with apertures 50, 51 on the left-hand side of the bipolar plate. The side of the upper and lower cover plates 6, 28 facing the window foils 10, 26 are also provided with two such grooved zones 57, 59 (only two of which are visible), that are aligned in exactly the same way as the grooved zones on the same lower or upper side of the bipolar plate 20. The window apertures 12, 15 in the window foils 10, 18, 22, 26 are disposed across the individual grooved zones of the bipolar plate 20. The window foils, the bipolar plate and the two cover plates 6, 28 are made of the same metal alloy, which has good electrical conductivity and which moreover has a coefficient of expansion that is adapted to the solid electrolyte. Typically, this involves alloys of one or more of the elements chromium, iron and/or nickel. Instead of the metal alloy, ceramics, such as lanthanum chromite that have good electrical conductivity and can be sintered in gas-tight fashion, could also be employed.

In the exemplary embodiment, the solid electrolyte frames 16, 24 are made of zirconium oxide. The four rectangular solid electrolyte small plates 64, 65, 66, 67, each of which are made of yttrium-stabilized zirconium oxide, are inserted into the solid electrolyte frames 16, 24 opposite the four window apertures 12, 13, 14, 15 of the window foils. In the exemplary embodiment, the upper surfaces of these small plates are coated, with the exception of a narrow peripheral region around them, with a lanthanum-strontium-manganese oxide compound as a cathode material 68 and their lower surfaces are correspondingly coated with a nickel-zirconium oxide cermet as an anode material 70 seen in FIG. 2. The small solid electrolyte plates have peripheral regions which rest on both sides on the edges of the windows of the window foils, and electrode material fills volumes defined by the window openings. A wing slot or gap in a pane between a free edge of the small solid electrolyte plates and the window foil contacting each is closed off in the exemplary embodiment by a solder 72 shown in FIG. 2 that is still stiff at an operating temperature, or in other words a temperature above 1100° C. When these individual building blocks 6, 10, 16, 18, 20, 22, 24, 26, 28 are put together to form a fuel cell stack 1, the individual plate-like components are soldered together in gas-tight fashion in the peripheral region surrounding the apertures, by means of this solder 72.

When such a fuel cell 2, 4 is in operation, oxygen-containing gas, such as air, is introduced at one end surface of the bipolar plate 20, which is the rear end surface of the stack 1 in the exemplary embodiment of FIG. 1, through the connection posts 40–43 and the apertures 52, 53 aligned with them, into the individual plate-like components 10, 16, 18, 20, 22, 24, 26, and is removed again on the opposite front side through the apertures 54, 55 and the connection posts 45–47. At the same time, on the right-hand end surface of the stack 1, in terms of the exemplary embodiment of FIG. 1, fuel, which is essentially hydrogen-containing gas, is introduced through the connection posts 31–34 and the apertures 48, 49 beneath them, and on the opposite left-hand end surface, this hydrogen-containing gas is removed again along with the product of oxidation, which is water vapor, through the apertures 50, 51 and the connection posts 35–38. In the process, the oxygen-containing gas flows along the grooved zones 57, 59 on the lower surface of the cover plate 28 and the lower surface of the bipolar plate, along the side of the small electrolyte plates 64, 65, 66, 67 that are coated with cathode material 68, and the hydrogen-containing gas flows along the top of the lower cover plate 6 and the grooved zones 56, 58 on the upper surface of the bipolar plate 20 and along the sides of the small electrolyte plates 64, 65, 66, 67 that are coated with anode material 70. The electromotive force developing in the two series-connected fuel cells can then be tapped at the contact tongues 8, 30 of the two cover plates 6, 28.

Figure 2:
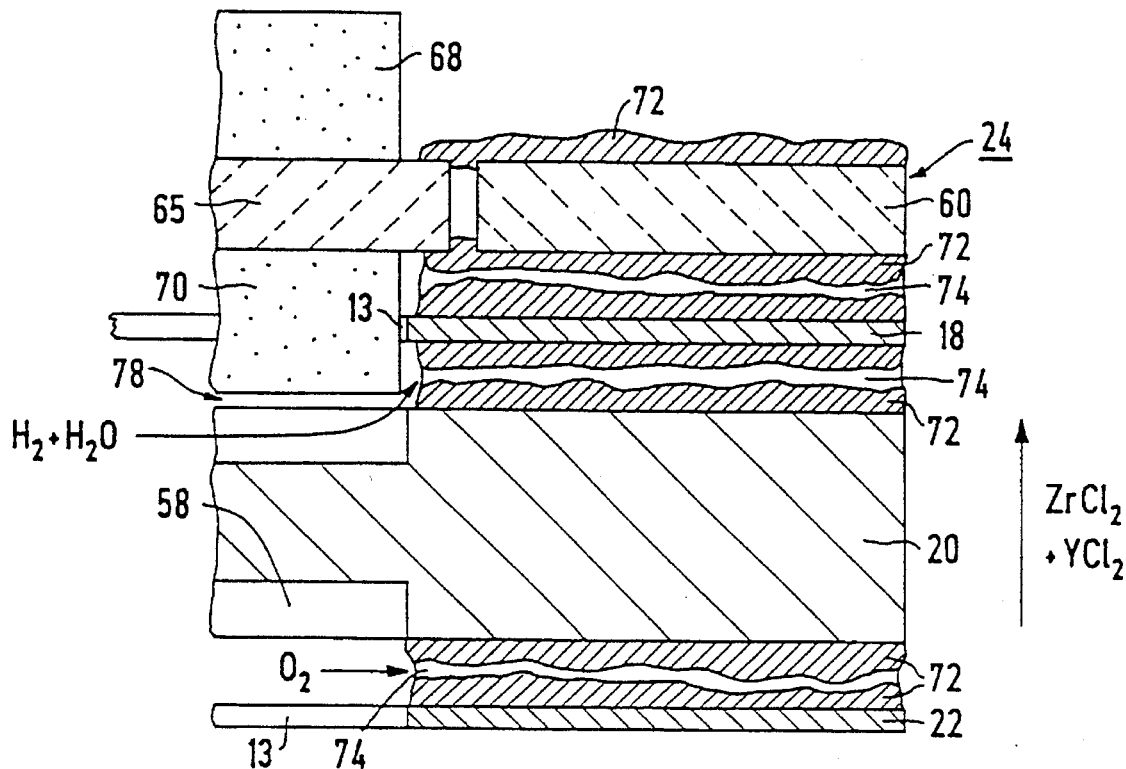
FIG. 2 is an enlarged, fragmentary, longitudinal-sectional view showing three leaks in a region of a solder point between a bipolar plate, a window foil, and an electrolyte in a high-temperature fuel cell.

FIG. 2 shows a greatly enlarged portion of the peripheral region of the bipolar plate 20 and of the two window foils 18, 22 immediately adjacent thereto, as well as of a solid electrolyte plate 24 contacting the one window foil 18. In this highly diagrammatic drawing, in the region of the joins between the plate-like components, one can see cut-open, diagrammatically illustrated gaps, which are intended to represent leaks 74 in the region of the solder 72. In order to seal these leaks, the fuel cell 2 is placed in a non-illustrated container that is evacuatable and preferably heatable. It is then flushed on the anode side with a mixture of hydrogen and nitrogen and on the cathode side with a mixture of oxygen and nitrogen, such as air. The temperature of the fuel cell 2, 4 is then raised to process temperature, that is to approximately 900° to 1100° C., by heating the flushing or scavenging gases which are initially supplied at atmospheric pressure. Once the process temperature is reached, the pressure of the gases is adjusted to from $10^{-3}$ to $10^{-5}$ bar. Besides hydrogen, water vapor is then introduced into the anode-side gas channels and spaces of the fuel cell. The gas composition in the cathode-side gas channels, which besides this carry oxygen, need not intrinsically be changed. A gas which is introduced into the evacuatable container contains a gaseous compound that can be oxidized to make a metal ion-conducting and/or oxygen ion-conducting oxide, preferably a compound of one or more of the metals of the electrolyte material, the bipolar plate 20, or the electrodes. In the exemplary embodiment, a gas mixture of zirconium chloride and yttrium chloride is used. In order to control the reaction speed, all of these gases may be further diluted with an inert gas, which in the present case is nitrogen. The oxygen activity of the water vapor or of the mixture of water vapor and hydrogen suffices for the oxidation of the zirconium chloride. On the other hand, it is not so strong that it could cause damage to the anode or oxidation of the nickel particles of the anode. On the other hand, as long as the fuel cell has still not been sealed, the oxygen activity of the mixture of water vapor and hydrogen should possibly be adjusted by the addition of inert gas in such a way that no harmful reduction of the cathodes can occur.

If the pressure inside and outside the fuel cells 2, 4 is the same, the gases then diffuse from the interior of the fuel cell through the leaks 74 in the solder 72 to the outside, and the gas located outside the fuel cell diffuses through these same leaks to the inside. The two gases meet one another at the leaks. Oxygen, which flows from the inside to the outside both from the cathode-side and the anode-side gas spaces and channels, reacts at the temperature of approximately 1000° C. with the gaseous compounds of the metals that flow in from outside the fuel cell and forms the corresponding metal oxides in the present case, zirconium oxide and yttrium oxide which grow in the leaks at the surfaces. In the exemplary embodiment, the oxygen reacts with zirconium chloride and yttrium chloride.

The lowered gas pressure increases the mean free path length of the gas atoms enough to ensure that the reaction occurs primarily in the region of the surfaces of the gaps or leaks at the joins. In this way, a good adhesion strength of the applied metal oxide to the inner surfaces of the leaks is attained.

The deposition of the finally sealing metal oxides at the gaps at the joins is further accelerated in the exemplary embodiment by the fact that a pressure difference between the two gas spaces, which changes intermittently in amount and direction, is established. In the exemplary embodiment, this is accomplished by raising the gas pressure in stages, in alternation in the space outside and the interior. These fluctuations can be attained by means of intermittent alternating throttling or reduction of the suction power of the vacuum pump for the two gas spaces, while the delivery of gas remains simultaneously unchanged. The frequency of these pressure fluctuations should preferably be made so short that the time is not sufficient for notable amounts of the gases to flow through the leaks as far as the opposite side thereof. To that end, among other options, depending on the cross section of the leak and the pressure difference, times of from 1 to 100 seconds can be employed. The result is pressure fluctuation frequencies on the order of magnitude of 1 to 0.01 Hz.

As soon as all of the leaks that lead from the interior of the fuel cell to the outside are closed, the chemical reaction and thus the rate of deposition of the ion-conducting metal oxide gradually fades away. Once a leak has already been closed, it is determined only by the ion conduction of the layer, which decreases as the layer thickness of the deposited metal oxide grows. The length of treatment can therefore be dimensioned to be adequately long without further disadvantages. However, leaks that may be present between gas channels in the interior of the fuel cell are not closed thereby. The way in which this is done will be explained in conjunction with FIG. 3.

Figure 3:
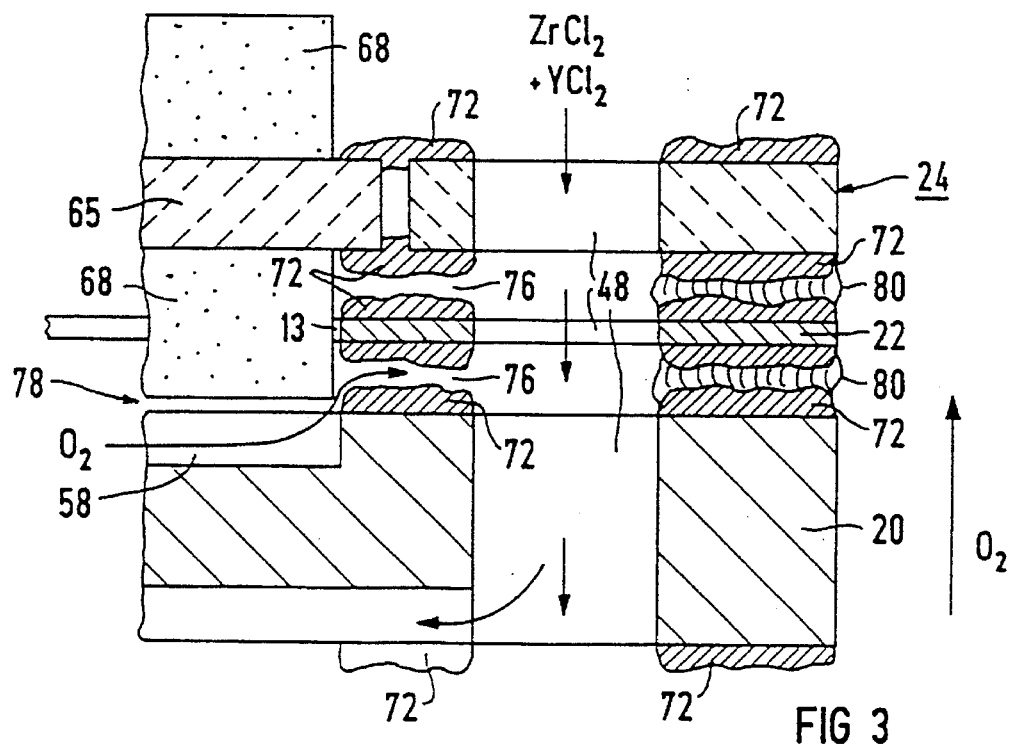
FIG. 3 is a view similar to FIG. 2 showing two leaks in a region of a gas distribution channel (many-folding channel) extending vertically through planes of the bipolar plate, the window foil and an electrolyte frame.

FIG. 3 shows an enlarged portion between a vertical gas channel, that is one extending in the direction of the normal to the plate-like components of the stack 1, through the apertures 48, which channel is intended to carry hydrogen-containing gas through the fuel cell stack during operation, and a gas space 78 substantially being formed of the grooved zone 58, in the interior of the fuel cell 2, which carries oxygen-containing gas during operation. In FIG. 3, leaks 76 between the gas channel passing through the aperture 48 and the inner gas space 78 of the fuel cell 2 are shown between the window foil 22 and the bipolar plate 20 contacting it on one side and the solid electrolyte plate 24 contacting it on the other side, in the region of the solder 72.

In order to seal off these leaks, the fuel cell is placed in an evacuatable and preferably heatable container, and as was explained in conjunction with the exemplary embodiment of FIG. 2, it is heated to process temperature, that is approximately 1000° C., through heated flushing gases. Next, the container and the gas channels and gas spaces are evacuated to approximately $10^{-4}$ bar. Next, through the gas channels that otherwise carry hydrogen-containing gas during operation, a gas that contains zirconium chloride and yttrium chloride is passed in the exemplary embodiment. The other gas channels and/or gas spaces are filled with an oxygen-containing gas, such as air. As is shown in connection with FIG. 2, the reactivity of these gases can be adjusted by supplying an inert gas. The oxygen-containing gases from the gas space 78 and the gas containing zirconium chloride and yttrium chloride from the gas channel 48 then meet in the leaks 76 between these two gas spaces, and they seal off these leaks in the same way as has been explained in conjunction with FIG. 2. The same thing happens in the leaks between the gas spaces that carry oxygen-containing gas and the adjacent gas channels that carry fuel during operation, or in other words in particular in the leaks between the small solid electrolyte plates 64–67, the window foils containing them, and the solid electrolyte frames. Once again it is helpful if the pressures of the two gases is intermittently raised and lowered in alternation relative to one another.

It is a major advantage of the process described above that without dismantling fuel cells, the smallest possible gaps, pores, leaks or other unsealed spaces 74, 76 between the individual components of the fuel cell, as well as those that lead to the outside, or in other words those that exist in the interior of the fuel cell between various gas spaces, can be closed. Since a chemical reaction occurs only in the region of the leaks, as a precaution completely assembled fuel cells, or in other words those for which there is a mere suspicion, can even be subjected to such a treatment. It is in no way necessary that these leaks be located in the region of the solder. Instead, even a non-presoldered fuel cell, in which the individual components rest on one another in loose mechanical contact or are pressed against one another, can also be sealed in this way. A mechanically stable, gas-tight join of the individual components is attained.

If there are significant leaks, and especially if non-soldered fuel cells are to be joined in gas-tight fashion, it is recommended that, prior to the actual sealing process, the anode side be flushed with a heated mixture of hydrogen and nitrogen and the cathode side be flushed with a heated mixture of oxygen and nitrogen, in which the proportion of inert gas, or in other words the proportion of nitrogen, is sharply raised. This is intended to assure that as long as the cell is not yet sealed, explosive gas reactions cannot cause any local overheating. The length of the process for sealing the leaks is expected to be on the order of magnitude of 1 hour, but longer times are harmless. Once the process is concluded and the sealed fuel cell has cooled down, care should be taken not to introduce any oxygen to the anode side or any fuel to the cathode side.

In order to heat the fuel cells, eddy current heating is also suitable. It may be employed in addition to the heating with preheated gases.

In a departure from the exemplary embodiments of FIGS. 2 and 3, instead of the solder, a paste of zirconium oxide, nickel, and/or an oxide or a precursor thereof that is a better electronic conductor than zirconium oxide, along with an additive that can oxidize or evaporate without residue, may be placed in the region of the bearing surfaces to be sealed between the individual components, prior to assembly. The assembled fuel cell, or the assembled stack of fuel cells, is then heated to sintering temperature before or during the action of the first, second and further gases. Unlike the solder 72 introduced in the exemplary embodiment of FIGS. 2 and 3, this paste does not lead to sealing of the gaps between the individual components, but rather after the heating to sintering temperature, it leads to an evaporation or oxidation away of the additive and sintering of the zirconium oxide and nickel, or of the introduced oxides or their precursors, to form a porous ceramic body that completely fills up the gaps. This body may also sinter to the adjacent components. The ceramic intermediate layer thus introduced instead of the solder has a defined porosity and fills up all of the irregularities, gaps and cracks. The defined porosity of this ceramic makes it possible for these pores to be reliably sealed with the first, second and further gas.

Figure 4:
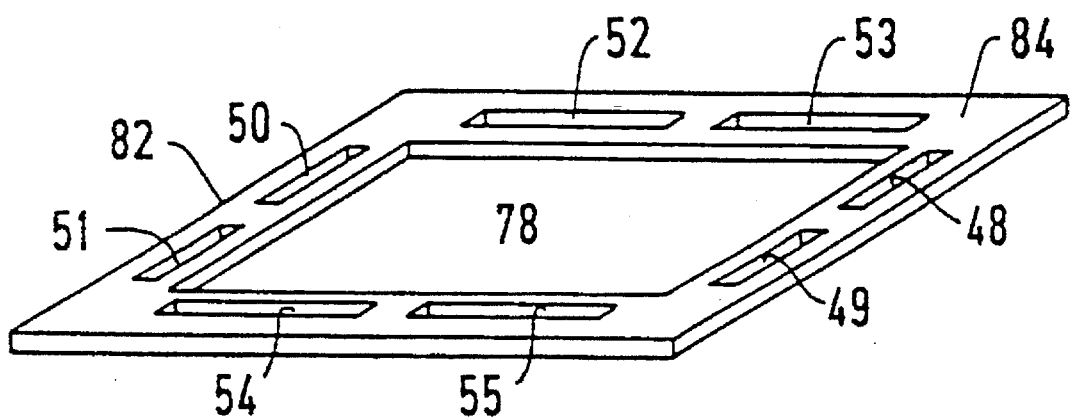
FIG. 4 is a perspective view of a green foil with stamped-out gas channels.

FIG. 4 shows a frame 82 of a green foil 84, being formed of zirconium oxide, nickel, and/or an oxide or a precursor thereof with better electronic conductivity than zirconium oxide, and an additive. With respect to its apertures 48–55 and its internal and external contour, it is congruent with the plate-like stacked components of the fuel cells or fuel cell stack, that is the frame 60, 62 which surrounds the small solid electrolyte plates 64, 65, 66, 67, the window foils 10, 18, 22, 26, as well as the bipolar plate 20. Polyvinyl alcohol is employed in the exemplary embodiment as an additive. This material has the property of binding the other components of the green foil or paste during the processing and upon being heated, before sintering, it volatilizes or combusts without residue. What remain are the volumes that were previously occupied by that additive, which generate a uniform porosity of the sintered body created at the sintering temperature, with the other components, because of the prior homogeneous mixing of the additive. At the same time, this sintered body can also sinter to the solid electrolyte frame, the window foils, and the bipolar plates. It thus also contributes to the mechanical strength of the fuel cell or fuel cell stack.

Before assembly or before being placed between the window foils and the bipolar plates on one hand and the window foils and the solid electrolyte frame on the other hand, the green foil is stamped out congruently, with respect to its internal and external peripheries, with the apertures 48–55 in the aforementioned components. In use, the stamped-out green foils are placed on both sides of the window foils and the components contacting the window foils, such as the solid electrolyte frame or the bipolar plate or the top and bottom cover plate, and they replace the solder, or the paste of zirconium oxide, nickel, and/or an oxide with better electronic conduction than zirconium oxide, to be used instead of solder. As a result it is assured that the cross sections of the apertures will not mistakenly be constricted or smeared closed.

Upon assembly of the high-temperature fuel cell, or the stack of high-temperature fuel cells, with the intervening green foils 82, all of the apertures 48–55 and gas flow paths thus remain free. When the fuel cell or stack of fuel cells is later heated, the additive evaporates and burns without residue. Once the sintering temperature is reached, the remaining material of the green foil sinters intrinsically, and optionally also sinters to the other adjacent components. The fuel cell or fuel cell stack which is thus obtained then contains only a porous ceramic structure between the components to be sealed, with a pore diameter that is defined within narrow limits. This diameter is excellently suitable for being sealed off completely by the process which was first described above.

Instead of polyvinyl alcohol, tylose or some other, preferably organic plastic that has a dough-like consistency, that can bind metal oxide particles, and that can evaporate or burn without residue, may be used as an additive for the foil and for the paste.

We claim:

1. In a process for sealing leaks in at least one of gas spaces and gas channels located between individual components of high-temperature fuel cells having electrolyte material, a bipolar plate and electrodes each containing at least one metal, the improvement which comprises:

introducing at least first and second different gases at high temperature from the outside into at least one of the gas spaces and gas channels to be sealed off from one another, for flushing every leak with the first gas on one side of said space or channel and with at least the second gas on the other side of said space or channel;

the first gas comprising at least one gaseous compound to be oxidized to form at least one of a metal ion-conducting and an oxygen ion-conducting oxide, and at least the second gas comprising oxygen and/or being able to give off oxygen; and the first gas comprising at least one material selected from the group consisting of at least one oxidizable compound selected from the group of metals consisting of the electrolyte material, the bipolar plate, the electrodes, and one element of the group consisting of zirconium, nickel, calcium, magnesium, cerium and rare earth metal.

2. The process according to claim 1, which comprises admixing an inert gas selected from the group consisting of $N_2$ and a noble gas with the at least first and second gases, for adjusting reactivity.

3. The process according to claim 1, which comprises bathing the outside of the fuel cell with the first gas, and passing a flow of the second gas through the fuel cell on a cathode side and a flow of a further gas through the fuel cell on a anode side.

4. The process according to claim 3, which comprises introducing the further gas selected from the group consisting of water vapor and a mixture of water vapor and hydrogen gas at the anode side of the fuel cell.

5. The process according to claim 4, which comprises introducing the further gas selected from the group consisting of at least one of CO-containing and $CO_2$-containing gas at the anode side of the fuel cell.

6. The process according to claim 1, which comprises introducing the first gas at the anode side and the second gas at the cathode side of the fuel cell.

7. The process according to claim 1, which comprises admixing at least one component selected from the group consisting of water vapor, noble gas and nitrogen with oxygen contained in the second gas, for weakening its oxidative action.

8. The process according to claim 1, which comprises selecting the oxidizable gaseous compound of the first gas as a halogen compound.

9. The process according to claim 8, which comprises selecting the first gas as a gas containing a chloride.

10. The process according to claim 1, which comprises:

introducing a mixture of at least one material selected from the group consisting of zirconium oxide, nickel, an oxide and a precursor of the oxide with better electronic conductivity than zirconium oxide, and an additive, in the vicinity of contact surfaces to be sealed between the components, before the components are assembled; and heating the assembled fuel cell or fuel cell stack to a sintering temperature, no later than during the introduction of the at least first and second gases.

11. The process according to claim 10, which comprises applying a paste of at least one material selected from the group consisting of zirconium oxide, nickel, an oxide and a precursor of the oxide with better electronic conductivity than zirconium oxide, and an additive, to bearing surfaces to be sealed between the individual components before assembly.

12. The process according to claim 10, which comprises placing a green foil having a congruent form and dimensions and containing a material selected from the group consisting of zirconium oxide, nickel, an oxide and a precursor of the oxide with better electronic conduction than zirconium oxide, and an additive, between the bearing surfaces to be sealed, prior to the assembly.

13. The process according to claim 10, which comprises selecting polyvinyl alcohol as an additive.

14. The process according to claim 10, which comprises selecting tylose as an additive.

15. The process according to claim 1, which comprises preventing the process temperature from exceeding 1300° C.

16. The process according to claim 15, which comprises setting the process temperature to be on the order of 1000° C.

17. The process according to claim 1, which comprises establishing a gas pressure of approximately $10^{-3}$ to $10^{-5}$ bar.

18. The process according to claim 1, which comprises establishing a gas pressure of the first gas being higher than that of at least the second gas, intermittently with establishing a gas pressure of at least the second gas being higher than that of the first gas.

19. The process according to claim 18, which comprises maintaining a polarity of a pressure difference between the two gases for from 1 to $10^3$ seconds.

20. The process according to claim 17, which comprises raising the pressure of the two gases in stages in alternation.

21. The process according to claim 1, which comprises initially flushing a still unsealed fuel cell with a mixture of oxygen and nitrogen on the cathode side and with a mixture of hydrogen and nitrogen on the anode side, and preheating the still unsealed fuel cell in the process for approximately 1 hour, and subsequently lowering the process pressure, raising the temperature all the way to the process temperature, and simultaneously introducing the process gases.

22. The process according to claim 21, which comprises heating the flushing gases for preheating the fuel cell.

23. The process according to claim 1, which comprises heating the fuel cell through eddy current heating.

* * * * *